US009165865B2

(12) United States Patent
Herbsommer et al.

(10) Patent No.: US 9,165,865 B2
(45) Date of Patent: Oct. 20, 2015

(54) ULTRA-THIN POWER TRANSISTOR AND SYNCHRONOUS BUCK CONVERTER HAVING CUSTOMIZED FOOTPRINT

(75) Inventors: Juan A Herbsommer, Schnecksville, PA (US); Osvaldo J Lopez, Annandale, NJ (US); Jonathan A Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1118 days.

(21) Appl. No.: 13/082,147

(22) Filed: Apr. 7, 2011

(65) Prior Publication Data

US 2012/0256239 A1    Oct. 11, 2012

(51) Int. Cl.
*H01L 29/78*    (2006.01)
*H01L 23/495*    (2006.01)
*H01L 23/31*    (2006.01)
*H01L 23/00*    (2006.01)

(52) U.S. Cl.
CPC .... *H01L 23/49537* (2013.01); *H01L 23/49548* (2013.01); *H01L 23/49562* (2013.01); *H01L 23/49575* (2013.01); *H01L 24/20* (2013.01); *H01L 23/3107* (2013.01); *H01L 24/19* (2013.01); *H01L 24/27* (2013.01); *H01L 24/29* (2013.01); *H01L 24/32* (2013.01); *H01L 24/33* (2013.01); *H01L 24/83* (2013.01); *H01L 2224/211* (2013.01); *H01L 2224/2101* (2013.01); *H01L 2224/215* (2013.01); *H01L 2224/2732* (2013.01); *H01L 2224/291* (2013.01); *H01L 2224/293* (2013.01); *H01L 2224/2929* (2013.01); *H01L 2224/29193* (2013.01); *H01L 2224/32227* (2013.01); *H01L 2224/32245* (2013.01); *H01L 2224/33181* (2013.01); *H01L 2224/838* (2013.01); *H01L 2224/83192* (2013.01); *H01L 2224/83815* (2013.01); *H01L 2224/83851* (2013.01); *H01L 2924/1306* (2013.01); *H01L 2924/13091* (2013.01)

(58) Field of Classification Search
CPC ............ H01L 23/49537; H01L 23/49548; H01L 23/49562; H01L 23/49575; H01L 24/20
See application file for complete search history.

(56) References Cited

U.S. PATENT DOCUMENTS

| | | |
|---|---|---|
| 2003/0020147 A1 | 1/2003 | Kobayakawa et al. |
| 2009/0057855 A1 | 3/2009 | Quinones et al. |
| 2010/0148346 A1 | 6/2010 | Quinones |
| 2010/0219519 A1 | 9/2010 | Owyang et al. |
| 2011/0074007 A1 | 3/2011 | Lopez et al. |

*Primary Examiner* — Long Pham
(74) *Attorney, Agent, or Firm* — Steven A. Shaw; Charles A. Brill; Frank D. Cimino

(57) ABSTRACT

A packaged power transistor device (100) having a leadframe including a flat plate (110) and a coplanar flat strip (120) spaced from the plate, the plate having a first thickness (110a) and the strip having a second thickness (120a) smaller than the first thickness, the plate and the strip having terminals (212; 121a). A field-effect power transistor chip (210) having a third thickness (210a), a first and a second contact pad on one chip side, and a third contact pad (211) on the opposite chip side, the first pad being attached to the plate, the second pad being attached to the strip, and the third pad being coplanar with the terminals. Encapsulation compound (130) filling the thickness difference between plate and strip, and spaces between chip and terminals, wherein the compound has a surface (101) coplanar with the plate surface (111) and the opposite surface (102) coplanar with the third pad (211) and the terminals (212; 212a), the distance (104) between the surfaces being equal to the sum of the first (110a) and third (210a) thicknesses.

10 Claims, 7 Drawing Sheets

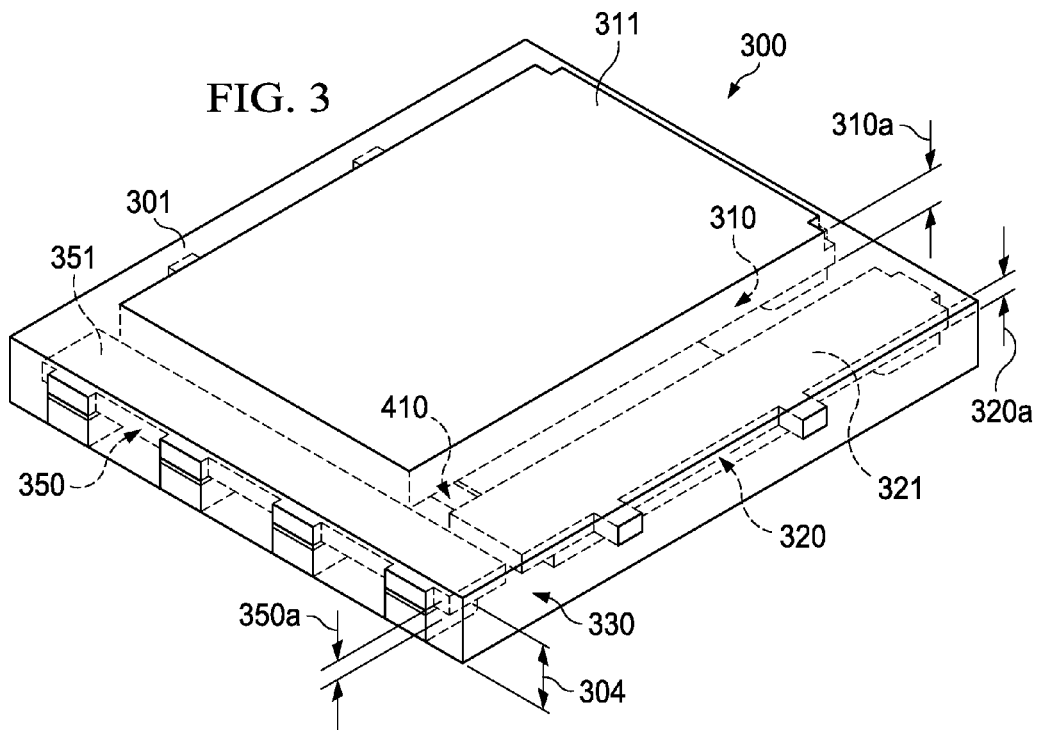
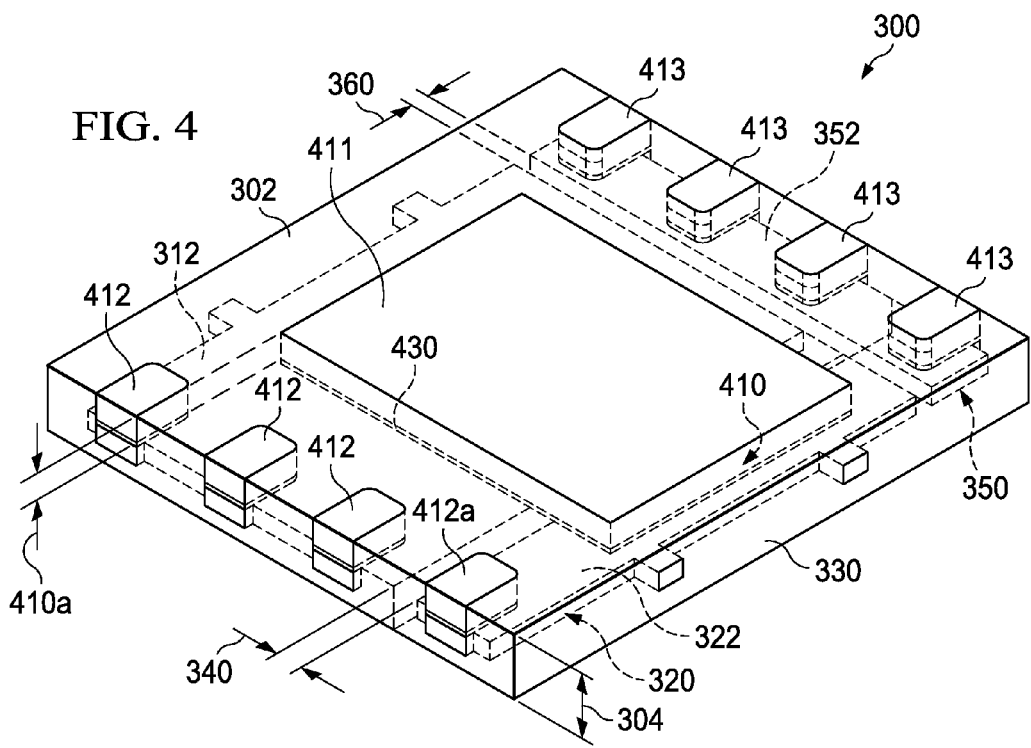

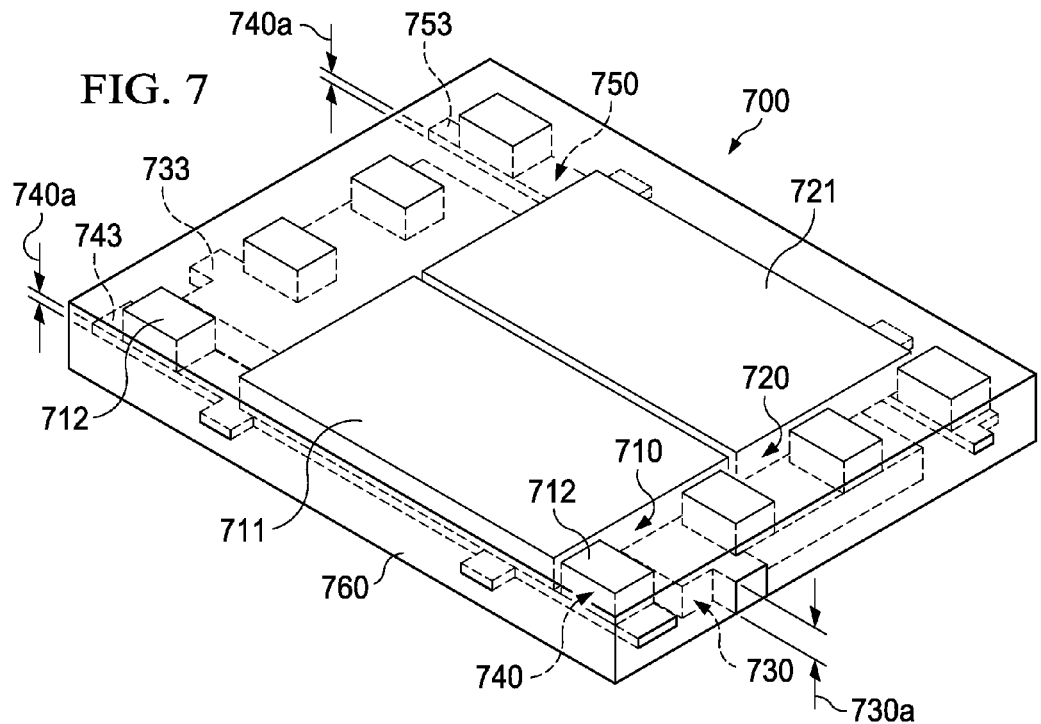
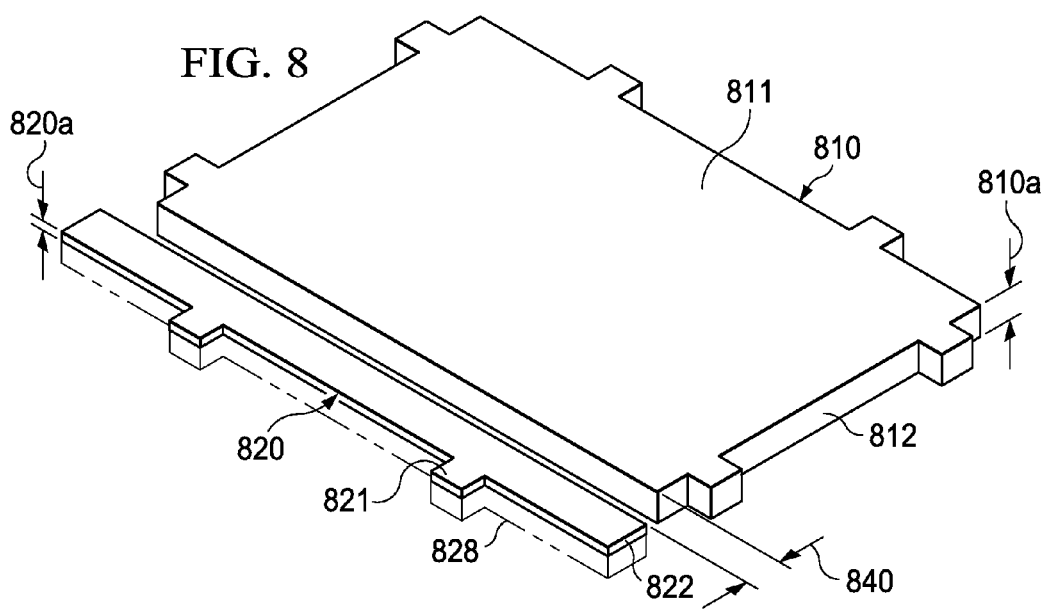

ULTRA-THIN POWER TRANSISTOR AND SYNCHRONOUS BUCK CONVERTER HAVING CUSTOMIZED FOOTPRINT

FIELD OF THE INVENTION

The present invention is related in general to the field of semiconductor devices and processes, and more specifically to the system structure and fabrication method of very thin, but thermally efficient power supply modules.

DESCRIPTION OF RELATED ART

Among the popular families of power switching devices are the DC-DC power supply circuits, especially the category of Switched Mode Power Supply circuits. Particularly suitable for the emerging power delivery requirements are the synchronous Buck converters with two power MOS field effect transistors (FETs) connected in series and coupled together by a common switch node. In the Buck converter, the control FET chip is connected between the supply voltage $V_{IN}$ and the LC output filter, and the synchronous (sync) FET chip is connected between the LC output filter and ground potential.

The gates of the control FET chip and the sync FET chip are connected to a semiconductor chip including an integrated circuit (IC) acting as the driver of the converter, and the driver, in turn, is connected to a controller IC. Preferably, both driver and controller ICs are integrated on a single chip, which is also connected to ground potential.

For many of today's power switching devices, the chips of the power MOSFETs and the chip of the driver and controller IC are assembled as individual components. Each chip is typically attached to a rectangular or square-shaped pad of a metallic leadframe; the pad is surrounded by leads as output terminals. The leads are commonly shaped without cantilever extensions, and arranged in the manner of Quad Flat No-Lead (QFN) or Small Outline No-Lead (SON) devices. The electrical connections from the chips to the leads are provided by bonding wires, which introduce, due to their lengths and resistances, significant parasitic inductance into the power circuit. Each assembly is typically packaged in a plastic encapsulation, and the packaged components are employed as discrete building blocks for board assembly of power supply systems.

In other power switching devices, the power MOSFET chips and the driver-and-controller IC are assembled horizontally side-by-side on a leadframe pad, which in turn is surrounded on all four sides by leads serving as device output terminals. The leads are shaped in QFN or SON fashion. The electrical connections between the chips and the leads are provided by bonding wires. The devices are packaged in a plastic encapsulation.

In some recently introduced advanced assemblies, clips substitute for many connecting wires. These clips are wide and introduce minimum parasitic inductance. However, in power MOSFET chips with vertical current flow, clips need to connect the front metal of the control FET chip to the leadframe of the sync FET chip. This approach consumes area and increases the footprint of the module.

In still another recently introduced power MOSFET assembly, connecting clips and wire bonds are avoided by providing a leadframe with an assembly pad divided into two portions for a power chip with a first and a second terminal on one die side and a third terminal on the opposite die side. The chip is flip-assembled (using metal bumps or solder paste dispensed from a syringe) onto the leadframe pad so that the first terminal is contacting one pad portion and the second terminal is contacting the other pad portion. Both leadframe portions have rims bent so that, after the flip-assembly, the rims become coplanar with the third terminal; all three MOSFET terminals can thus be attached to a printed circuit board (PCB). After this attachment, the leadframe pad is remote from the PCB, but since it is divided into two portions serving two die terminals, a heat sink cannot be attached to the pad.

In still another recently introduced power MOSFET package, a leadframe is provided with a flat pad divided into two portions, which can be attached to a PCB. The first and the second terminals of a power chip are attached to these pad portions. The third chip terminal, remote from the leadframe pad, is contacted by a metal clip, which has a rim bent towards a lead of the leadframe, allowing all three die terminals to be assembled on the PCB. The clip is made of a metal thick enough to permit the attachment of a heat sink to the clip for cooling the third chip terminal. The MOSFET package thus has a three-strata structure of leadframe-chip-clip.

SUMMARY OF THE INVENTION

Applicants recognized that widespread applications of power converters in markets as diverse as handheld, laptop, automotive, and medical products require packages for MOS field effect transistors (FETS) and converters, which are extremely thin yet still offer thermal and electrical efficiencies close to the theoretical maximum. Applicants saw that the three-strata structures of existing MOSFETS, combining the thicknesses of a leadframe, a chip and a clip, are too thick for many emerging applications. In addition, these devices tend to be burdened with parasitic electrical and thermal resistances and thus fall way short of reaching maximum thermal and electrical efficiencies. As an additional emerging need for customer-friendly usage, applicants recognized that power FET packages should preferably permit direct implementation into printed circuit boards (PCB) without the headache of first modifying a footprint.

Applicants solved the problem of reducing the overall thickness of high power MOSFET packages, when they discovered a two-strata assembly of a FET chip attached to a leadframe, resulting in package with a first, a second and a third terminal on one side of the package, and the first, second or third terminal on the opposite side of the package, wherein the terminal on the opposite side is available for intense cooling. The sole terminal on the opposite side is achieved by assembling the FET chip on a leadframe pad having portions with two distinct thicknesses; after encapsulation, the thinner portion is shielded under a coat of insulating material, leaving the un-shielded thicker portion exposed and available for cooling.

In an exemplary preferred embodiment, the first terminal is the source of the FET, the second terminal is the drain, and the third terminal is the gate; all three terminals show on one package side and are available for attachment to a PCB; the sole terminal on the opposite package side is the source of the FET, attached to the thicker leadframe portion. The package thus has a two-strata structure and a thickness consisting of the sum of the chip thickness and the thickness of the thick leadframe portion, in the exemplary embodiment totaling less than 0.5 mm. When cooled, for instance by a heat sink attached to the thick leadframe portion, the FET package can handle up to 35 A.

The fabrication of an exemplary two-strata FET die package starts with a leadframe pad having two flat portions; the first portion has a first thickness and the second portion has a second thickness smaller than the first thickness. One surface of both portions is coplanar and thus offers a plane for attaching the FET chip; the opposite surface exhibits a step caused by the thickness difference. Next, the FET die is attached across the pad portions; as an example, the source is tied to the first portion and the gate is tied to the second portion; the preferred method of attaching is solder screen printing. Metal parts are then added to the coplanar surface of the pad portions as terminals of the two portions (preferably using solder screen printing). The height of the attached terminals is selected so that the terminals are coplanar with the un-attached die surface; in the example, the un-attached die surface is the FET drain.

In the following encapsulation process, the aforementioned thickness step is filled with encapsulation compound, whereby the surface of the thinner pad portion is hidden under insulating material and the surface of the thicker pad portion remains exposed. This exposed leadframe surface is thus available for the attachment of a heat sink suitable for directly cooling the heat caused by the operational current of the FET.

BRIEF DESCRIPTION OF THE DRAWINGS

FIG. 3 illustrates another embodiment in a perspective view of the top side of a power FET package with transparent encapsulation compound.

FIG. 4 shows the same embodiment as FIG. 3 in a perspective view of the bottom side of a power FET package with transparent encapsulation compound.

FIG. 7 shows another embodiment viewed from the bottom. Dual chips are the building blocks for a synchronous Buck converter with the thicker plate of the leadframe acting as switch node exposed on the top side (not shown).

FIGS. 8 to 12 display certain steps of the fabrication process flow of two-strata packages for power FETS.

FIG. 8 is a perspective view of the coplanar surface of a leadframe including a flat plate of a first thickness and a flat strip of a second thickness smaller than the first thickness.

FIG. 9 is a perspective view of patches of attachment material, such as solder paste, applied to the leadframe plate and strip of FIG. 8.

FIG. 10 is a perspective view of a power FET chip attached to the leadframe of FIG. 9.

FIG. 11 illustrates a plurality of piece parts including terminals aligned with the leadframe of FIG. 10, readied for the step of attaching them to the leadframe.

FIG. 12 depicts the chip assembly on the leadframe after attaching the terminals and before encapsulating the assembly in packaging material.

DETAILED DESCRIPTION OF THE PREFERRED EMBODIMENTS

Figure 1:
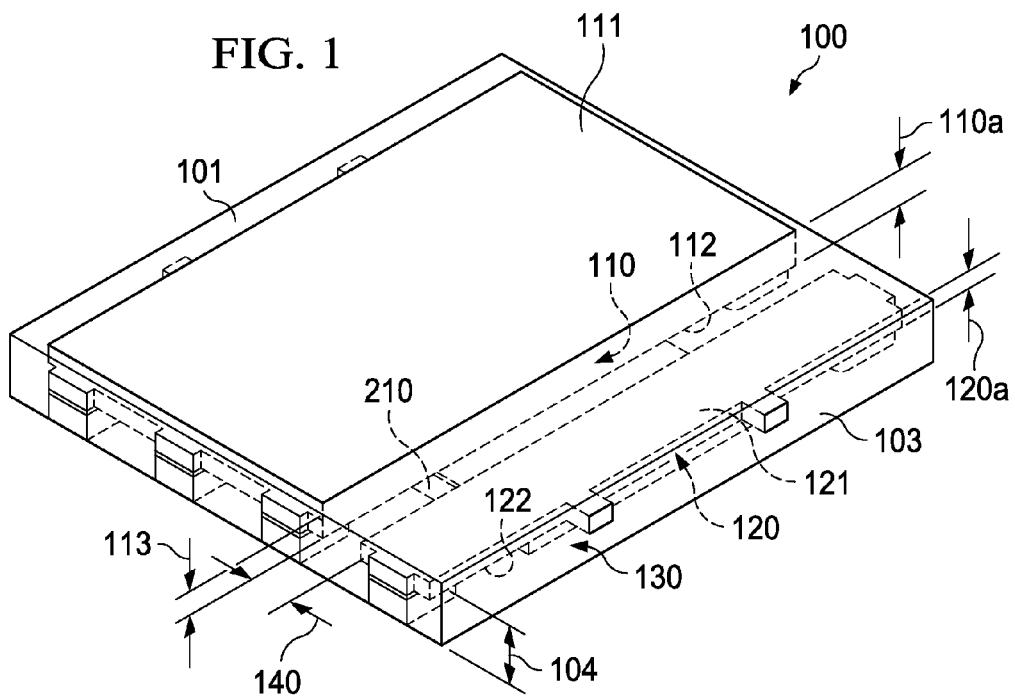
FIG. 1 shows an embodiment of the invention in a perspective view of the top side of a power field-effect transistor (FET) package with transparent encapsulation compound.
Figure 2:
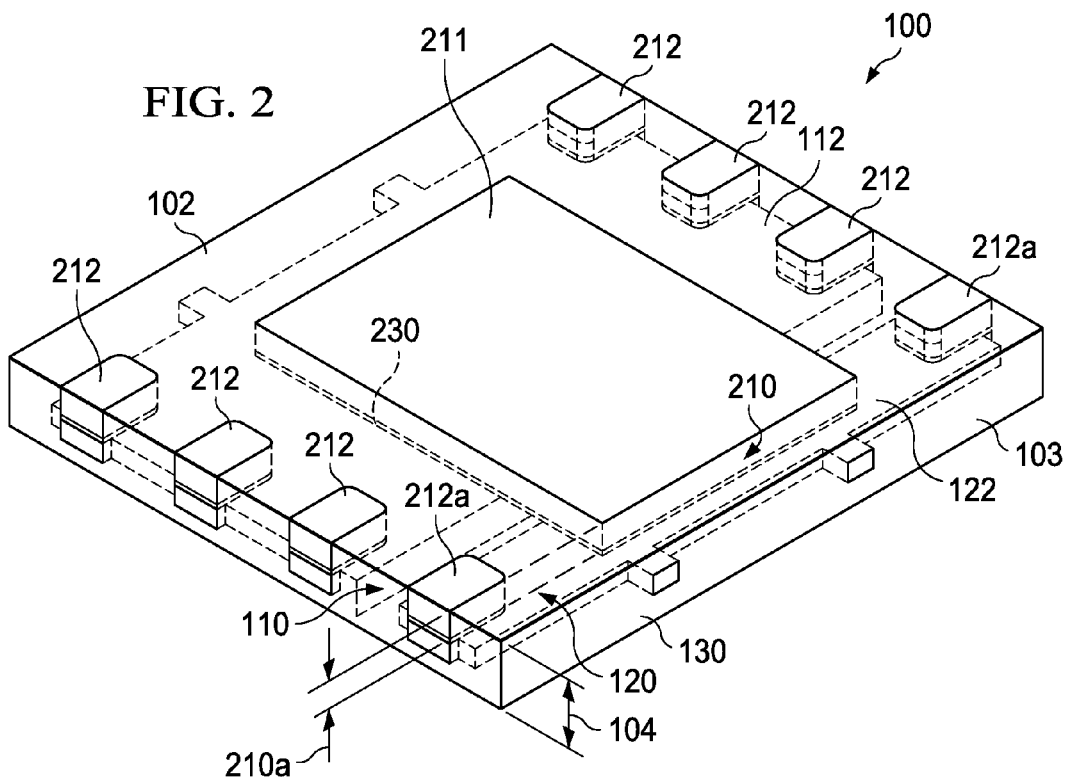
FIG. 2 displays the same embodiment as FIG. 1 in a perspective view of the bottom side of a power FET package with transparent encapsulation compound.

FIGS. 1 and 2 illustrate an exemplary embodiment of the invention, the package of a semiconductor power device intended for assembly on a substrate such as a motherboard. The package is particularly useful for packaging power field effect transistors (FET), power switches, power converters, which handle large electrical currents (for example, 20 to 35 A) and thus generate significant heat. The package, generally designated 100, is viewed from two perspectives: One perspective, herein referred to as the top view and shown in FIG. 1, illustrates the package as seen after board assembly. The opposite perspective, herein referred to as the bottom view and shown in FIG. 2, illustrates the package as seen from the board before attachment. For clarity's sake, the packages in FIGS. 1 and 2 are assumed to be encapsulated in transparent insulating compound 130; in reality, the compound has to be opaque (for instance a black-colored epoxy-based molding compound) in order to protect the semiconductor chip against light in the visible wave length regime.

FIGS. 1 and 2 indicate that device 100 has a planar top surface 101, a planar bottom surface 102, side surfaces 103 at right angles with the top and bottom surfaces, and a thickness 104 small compared to the lateral dimensions of the device. A preferred thickness range is less than 0.5 mm, for instance between 0.42 and 0.45 mm. The large metal area 111, exposed on the top surface 101, belongs to a flat leadframe plate designated 110.

Through metal area 111, leadframe plate 110 can dissipate a significant amount of heat into the ambient; the thermal energy is generated during the operation of the power chip 210, which is attached to the surface 112 of plate 110 opposite to area 111. The heat dissipation can be greatly enhanced when a heat sink is attached to metal area 111. In order to facilitate the attachment of a heat sink, it is an advantageous to provide the metal area 111 with a solderable metallurgical preparation, such as a layer of tin or nickel. Plate 110 is preferably made of copper or copper alloy; other alternatives include iron-nickel alloys (such as Alloy 42), aluminum, and Kovar™. Plate thickness 110a is preferably between about 0.15 and 0.25 mm, but may be thinner or thicker. Plate thickness 110a is herein referred to as first thickness 110a.

Leadframe plate 110 constitutes the first stratum of the packaged device 100. As used herein, stratum refers to a stretched-out section of material, one of several lying one upon another. As indicated in FIG. 1, plate 110 may have uniform thickness 110a throughout its extension; alternatively, it may have one or more thinned portions in order to enhance robust locking and adhesion to an encapsulation compound. When thinned portions are included, they are preferably created by the same fabrication step; consequently, their thickness is the same as thickness 120a of strip 120 (see below).

The FET chip is emphasized in FIG. 2. As a field effect transistor, chip 210 has three contact pads: The first and second contact pads are on one chip side; this side and first and second contact pads are not shown in FIG. 2. The third contact pad is on the opposite chip side and is illustrated in FIG. 2 as the large metal area 211, exposed on the bottom surface 102. Area 211 has a solderable metallurgical composition to allow solder attachment to a metal area of a substrate such as a printed circuit board (PCB). Contact pad 211 is herein referred to as third contact pad. The large size of area of contact pad 211 enables dissipation of a significant amount of heat generated during the operation of power chip 210. When attached to a PCB metallization, the board acts as a heat sink.

In exemplary embodiments, chip 210 may be a field effect power transistor or another transistor made of silicon, gallium arsenide, another III-V compound, or a II-VI compound. Chip 210 has a thickness 210a; this thickness is herein referred to as third thickness 210a. Third thickness 210a ranges preferably between about 0.10 and 0.25 mm, but may be thicker or thinner. Chip 210 constitutes the second stratum of the packaged device 100. As FIGS. 1 and 2 illustrate, device package 100 is a two-strata device; plate 110 as the first stratum lies on top of chip 210 as the second stratum. Since device package 100 is free of metal clips and bonding wires, it does not include a third stratum. Consequently, device thickness 104 is substantially the sum of plate thickness 110a and chip thickness 210a; device thickness 104 may vary between 0.25 and 0.50 mm and is preferably between 0.25 and 0.30 mm.

Adjacent to contact pad 211 is a plurality of leads 212. In some embodiments, leads 212 are stamped or half-etched from an original metal sheet used to fabricate the leadframe. The height of leads 212 may be approximately 0.10 to 0.13 mm. In these embodiments, leads 212 are made of the same metal as plate 110 and strip 120. In other embodiments, leads 212 may be attached to flat plate 110 separately (process flow see below). In those embodiments, leads 212 may be made of the same metal as plate 110 and strip 120, or they may be made of a different metal. Leads 212 are terminals of device 100 and coplanar with third contact pad area 211. It is an advantage of rapid board assembly, customer satisfaction, and market penetration, when size and periphery of pad 211 as well as number and location of leads 212 conform to a standardized footprint provided by PCBS, such as a QFN Do-8 footprint.

In addition to flat plate 110, FIGS. 1 and 2 further indicate a flat strip 120 in package 100. Flat strip 120 is spaced apart from plate 110 by gap 140; further, strip 120 has a surface 122 coplanar with plate surface 112. Spanning across gap 140, chip 210 is attached to coplanar surfaces 112 and 122. Chip 210 is attached to plate 110 and strip 120 so that the first contact pad of the chip is attached to the plate, and the second contact pad of the chip is attached to the strip. In a preferred FET example, the first pad is the transistor's source terminal and the second pad is the transistor's gate terminal. Consequently, in the preferred example two rows of leads designated 212 (FIG. 2) are source terminals of device 100, and leads designated 212a are gate terminals. As described above, the third pad—the transistor's drain terminal of the preferred example—is exposed on the bottom surface 102 of assembled device 100 and has the large contact area 211, coplanar with terminal leads 212.

The attachment of the pads of chip 210 to leadframe plate 110 and strip 120 employs an electrically and thermally conductive layer designated 230 in FIG. 2. The layer is made of a material selected from a group including solder, conductive adhesive, z-axis conductor, carbon tubes, and rapheme material. The preferred material is a solder paste and the preferred attachment method includes a solder screen printing technique due to its simplicity and cost effectiveness. The thickness of layer 230 is small compared to plate thickness 110a and chip thickness 210a.

Strip 120 has a thickness 120a, which is herein referred to as second thickness 120a (see FIG. 1). Second thickness 120 is smaller than first thickness 110a of plate 110. As a consequence of this thickness difference, surface 121 of strip 120 is not coplanar with surface 111 of plate 110, but is offset. After the process step of encapsulating the assembled chip and leadframe, the thickness difference is filled with insulating compound 130. Relative to the un-encapsulated and exposed surface 111 of plate 110, strip surface 121 is hidden under encapsulation material 130 (and consequently shown in dashed outlines in FIGS. 1 and 2). A preferred material for insulating compound 130 is an epoxy-based molding compound as used in a transfer molding technique, the polymerized compound preferably having with strong adhesion to the surfaces of leadframe metal such as copper or copper oxide.

As FIGS. 1 and 2 indicate, encapsulation compound 130 also fills gap 140 between leadframe plate and strip, and any spaces between chip 210 and terminals 212. Encapsulation compound 130 has a surface coplanar with plate surface 111 (see FIG. 1), thus constituting device top surface 101, and the opposite surface coplanar with surface 211 of the third pad and with terminals 212 (see FIG. 2), thus constituting device bottom surface 102. As mentioned above, the distance 104 between surface 101 and surface 102 is equal to the sum of first thickness 110a of the plate and third thickness 210a of the chip (and the thickness of attachment layer 230).

FIGS. 3 and 4 depict another exemplary embodiment generally designated 300, viewed in FIG. 3 from the top side and in FIG. 4 from the bottom side. Again, for clarity's sake, the packages in FIGS. 3 and 4 are assumed to be encapsulated in transparent insulating compound 330. Device 300 has a preferred range of thickness 304 less than 0.5 mm, for instance between 0.42 and 0.45 mm. The large metal area 311, exposed on the top surface 301, belongs to a flat leadframe plate designated 310. Area 311 is suitable to dissipate a significant amount of heat into the ambient, especially when a heat sink is attached to metal area 311. Flat plate 310 has a thickness 310a (referred to as first thickness), preferably between 0.15 and 0.25 mm. Plate 310 constitutes the first stratum of the packaged device 300.

Analogous to device 100 in FIG. 1, embodiment 300 has a flat strip 320 spaced apart from plate 310 by gap 340 (see FIG. 4), and with a surface 322 coplanar with plate surface 312. Strip 320 has a thickness 320a (referred to as second thickness) smaller than first thickness 310a of plate 310. In addition, embodiment 300 has another flat strip 350 spaced apart from plate 310 by gap 360, and with a surface 352 coplanar with plate surface 312. Strip 350 has a thickness 350a smaller than first thickness 320a. Thickness 350a is preferably the same thickness as second thickness 320a of strip 320 (see FIG. 3). As stated, second thickness 320a is smaller than first thickness 310a of plate 310. As a consequence of the thickness difference between 310a and 320a (and 350a), surface 321 of strip 320 and surface 351 of strip 350 are not coplanar with surface 311 of plate 310, but are offset. After the process step of encapsulating the assembled chip and leadframe, the thickness difference is filled with insulating compound 330. Relative to the un-encapsulated and exposed surface 311 of plate 310, strip surfaces 321 and 351 are hidden under encapsulation material 330 (and consequently shown in dashed outlines in FIGS. 3 and 4).

The FET chip 410, in this embodiment a field effect transistor, is emphasized in FIG. 4. The first and second contact pads are on the chip side not shown in FIG. 4; the third contact pad is the large metal area 411, exposed on the bottom surface 302 of device 300. Area 411 has a solderable metallurgical composition to allow solder attachment to a metal area of a PCB. Chip 410 has a thickness 410a, herein referred to as third thickness. Third thickness 410a ranges preferably between about 0.10 and 0.25 mm, but may be thicker or thinner. Chip 410 constitutes the second stratum of the packaged device 300, rendering device 300 a two-strata device. Consequently, device thickness 304 is the sum of plate thickness 310a and chip thickness 410a (and the small thickness of attachment layer 430); device thickness 304 may vary between 0.25 and 0.50 mm and is preferably between 0.25 and 0.30 mm.

In FIG. 4, the aligned leads of plate 310 are designated 412; the lead of strip 320 is designated 412a; and the aligned leads of strip 350 are designated 413. In some embodiments, the leads are stamped or half-etched from an original metal sheet used to fabricate the leadframe. The height of the leads may be approximately 0.10 to 0.13 mm. In these embodiments, the leads are made of the same metal as plate 310 and strips 320 and 350. In other embodiments, the leads may be attached to plate and strips separately (process flow see below). In those embodiments, the leads may be made of the same metal as plate and strips, or they may be made of a different metal. Leads 412, 412*a*, and 413 are coplanar with third contact pad area 411.

Chip 410 is attached to plate 310 and strip 320 using an electrically and thermally conductive layer 430. In the attachment, the first contact pad of the chip is attached to the plate, and the second contact pad of the chip is attached to the strip. In a preferred FET example, the first pad is the transistor's source terminal and the second pad is the transistor's gate terminal. Consequently, in the preferred example one row of leads designated 412 (FIG. 4) is source terminals of device 100, and the lead designated 412*a* is the gate terminal. As described above, the third pad—the transistor's drain terminal of the preferred example—is exposed on the bottom surface 302 of assembled device 100 and has the large contact area 411, coplanar with terminal leads 412. Leads 413 remain isolated in FIG. 4.

Metal area 311 can dissipate a significant amount of heat into the ambient; the thermal energy is generated during the operation of the power chip 410, which has its source attached to plate 310. The heat dissipation can be greatly enhanced when a heat sink is attached to metal area 311. In order to facilitate the attachment of a heat sink, it is an advantageous to provide the metal area 311 with a solderable metallurgical preparation, such as a layer of tin or nickel.

Figure 5:
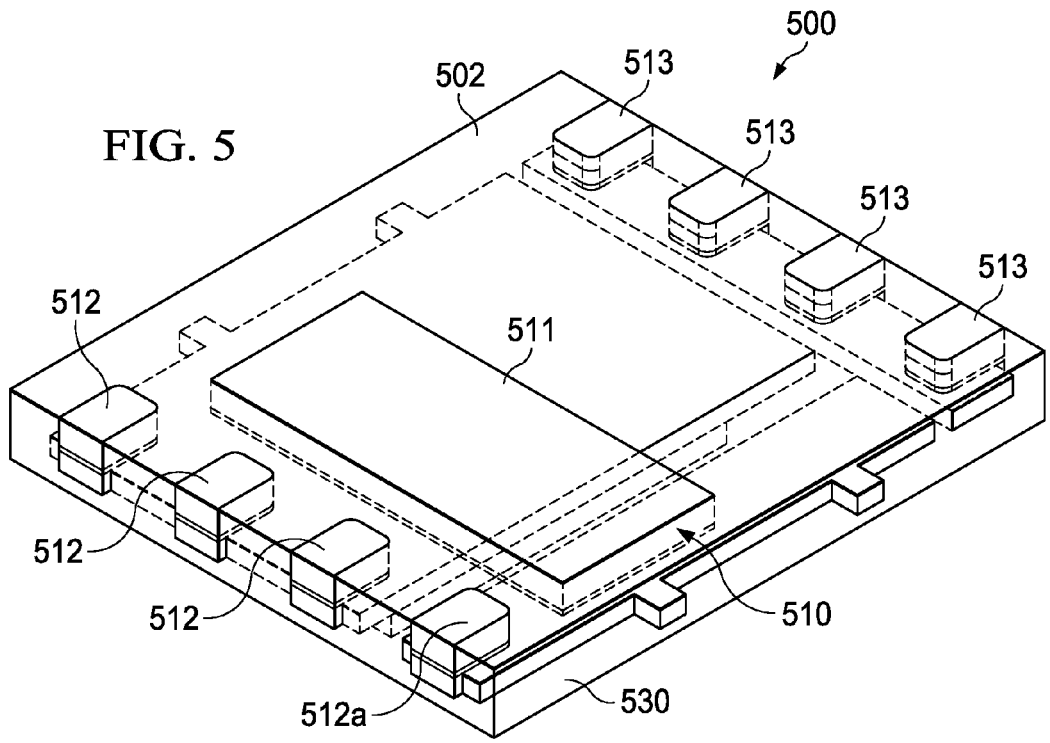
FIG. 5 displays another embodiment of a power FET package viewed from the bottom side showing a chip considerably smaller than the available plate and strip areas.
Figure 6:
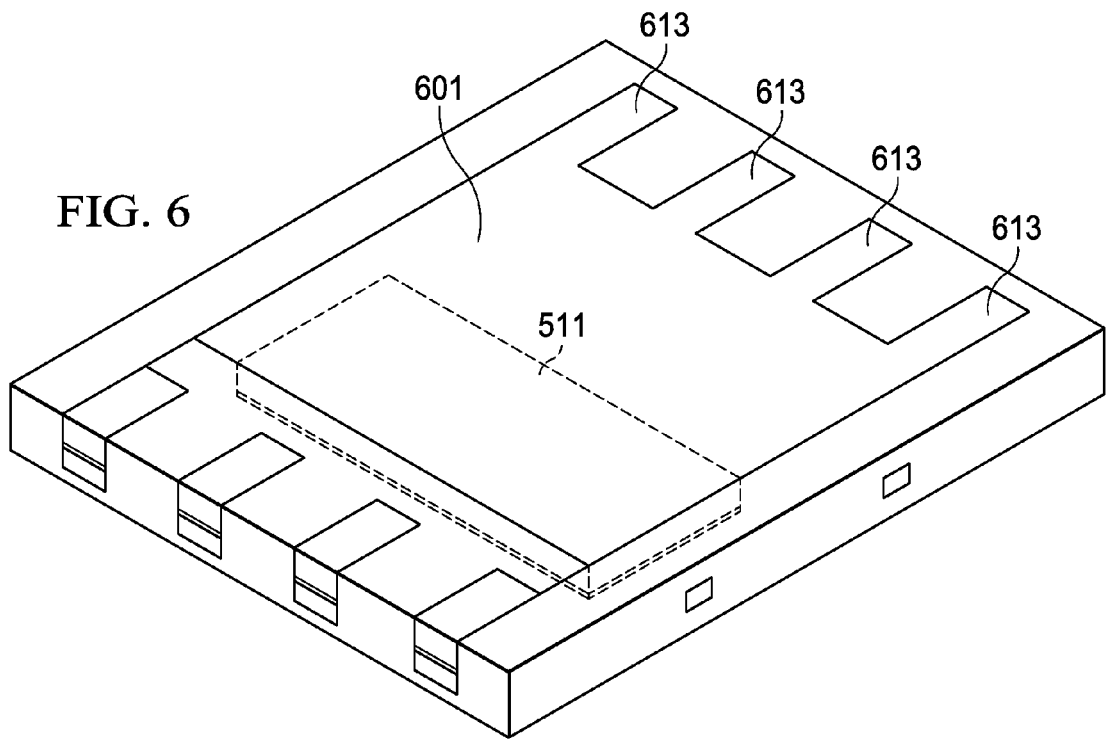
FIG. 6 illustrates the embodiment of FIG. 5 with a deposited metallization layer patterned to fit the conventional footprint for assembly on a PCB.

While leads 413 are still isolated in FIG. 4 after packaging the assembled chip in an encapsulation compound, they can be employed to adjust packaged power transistors with a variety of different chip sizes and configurations to a standardized footprint, as illustrated by the exemplary embodiments shown in FIGS. 5, 6 and 7. The device generally designated 500 in FIG. 5 employs a chip 510 of considerably smaller size than the outline offered by the available leadframe. Chip 510 has contact pad area 511. Rather than spending time and effort to develop a new leadframe of suitably small size for assembling chip 510 on a leadframe, FIG. 5 illustrates the methodology of assembling chip 510 on a readily available leadframe, which is identical to the one described in FIGS. 3 and 4. Analogous to FIGS. 2 and 4, a bottom device surface 502 is created by the process step of encapsulating; the encapsulation material 530, the exposed chip contact pad 511, and the leads 512, 512*a*, and 513 are coplanar.

In the next process step, a metal layer with a thickness between about 10 and 20 µm is deposited on the surface 502. A preferred deposition method includes coating the surface with a copper seed layer, followed by plating a layer of about 10 to 20 µm thickness using nickel and tin, or tin only. An alternative deposition method includes sputtering. The deposited metal layer provides not only electrical conductivity across the surface portions of the insulating compound 530, but also protection of the exposed chip pad 511 (for instance drain terminal) against direct mechanical contact stress (for instance Pogo pins during testing, or during multiprobing) and thermomechanical stress.

In the next process step, illustrated in FIG. 6, the metal layer, designated 601, is patterned, for instance by etching, in order to mimic a standard QFN footprint. By the patterning step, metal layer 601 conductively connects chip contact pad 511 to the leads 613 covering leads 513. Since in the above example the exposed pad 511 of the small-area chip is the FET drain terminal, leads 613 now become device drain terminals with standardized footprint—an advantage to customers who will not be compelled to re-layout their assembly board for accommodating a customized device footprint.

Another embodiment using the advantage of a deposited metal layer is depicted in FIG. 7 in a perspective bottom view of the device. The embodiment, generally designated 700, illustrates a building block of a synchronous Buck converter in a thin package. For clarity's sake the packaging material 760 is depicted transparent in FIG. 7. A first FET chip 710 and a second FET chip 720 are assembled on a leadframe plate 730. The thickness of plate 730 is designated 730*a*; it is referred to as first thickness. Plate 730 has a surface 733 covered by encapsulation compound. Device 700 further includes two leadframe strips 740 and 750, positioned parallel to plate sides and spaced from plate 730. Strip 740 has a surface 743 coplanar with plate surface 733, and strip 750 as surface 753 coplanar with plate surface 733. Both surface surfaces 743 and 753 are covered with encapsulation compound. Strips 740 and 750 have preferably identical second thickness 740*a* smaller than the first thickness 730*a*.

First FET chip 710 and second FET chip 720 are assembled on the coplanar surfaces 733, 743 and 753 so that the plate acts as the switch node of the synchronous Buck converter. Consequently, in the preferred assembly chip 710 has its source attached to plate 730 and its gate attached to strip 740; chip 720 has its drain attached to plate 730 and its gate attached to strip 750. Alternatively, the positioning of the chips may be reversed.

As a result of the preferred assembly, FIG. 7 shows the drain 711 of chip 710 exposed from the encapsulation compound, while the gate of chip 710 is contacted by leads 712; further the source 721 of chip 720 exposed from the encapsulation compound, and the gate of chip 720 contacted by leads 722. Not shown in FIG. 7 is the top side of device 700 with the switch node of the converter attached to the leadframe plate acting as effective heat spreader of Buck converter 700.

Another embodiment of the invention is a method for fabricating a low cost leadframe suitable for assembling power FET chips in a two-strata device free of bonding wires and clips, and packaging the assembly as a power field-effect transistor package less than 0.5 mm thick and able to handle currents of 20 to 35 A after attaching a heat sink to an exposed portion of the leadframe. It is cost effective to execute the method as a batch process. FIGS. 8 to 12 illustrate certain steps of the fabrication process flow.

The method starts by providing a flat sheet of metal between about 0.15 and 0.25 mm thick; the sheet may be thinner or thicker. Preferred metals include copper, aluminum, and iron-nickel alloy. A leadframe is then formed from the sheet as shown in FIG. 8. The leadframe includes a flat plate 810 and a coplanar flat strip 820 spaced from the plate by gap 840. After a stamping or etching step (so-called halfetching), plate 810 has a first thickness 810*a* and strip 820 has a second thickness 820*a* smaller than the first thickness 810*a*. As FIG. 8 shows, after the half-etch process, surface 821 of strip 820 remains coplanar with surface 811 of plate 810, while surface 822 of strip 820 is recessed relative to surface 812 of plate 820. The recess amount is indicated by phantom line 828.

The method continues by providing a field-effect power transistor chip with a third thickness. Preferably, the chip thickness is between about 0.10 and 0.20 mm, but may be thicker or thinner. The FET chip has a first and a second contact pad on one chip side and a third contact pad on the opposite chip side. Next, a material is selected, which enables the attachment of the FET pads to the leadframe; preferably the material is selected from a group including solder, conductive adhesive, z-axis conductor, carbon tubes, and grapheme material. The preferred material is solder paste. In the process step illustrated in FIG. 9, layers of the same attachment material are applied to both the leadframe plate (patches 930 and 931) and the leadframe strip (patches 930a and 932). When the attachment material is solder paste, the preferred application method is a low cost screen printing technique.

Figure 10:
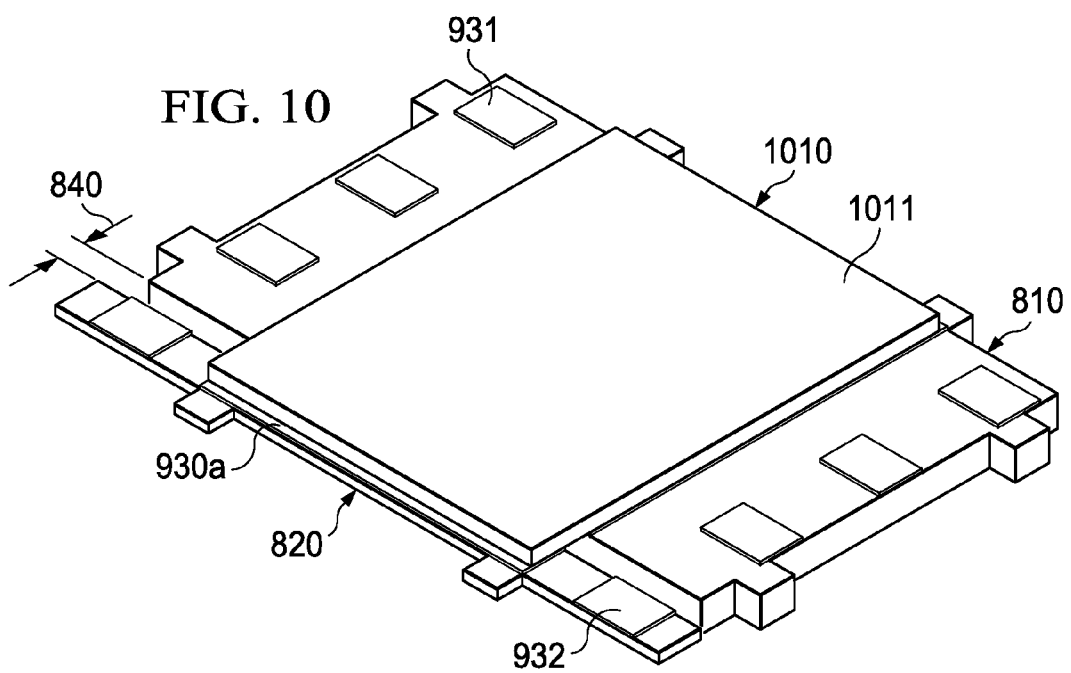

Then, the FET chip, designated 1010 in FIG. 10, is attached to the leadframe so that the first pad is attached to solder layer 930 on the plate 810 and the second pad is attached to solder layer 930a on the strip 820. Chip 1010 thus bridges the gap 840 between plate and strip. When the first FET contact pad is the source pad and the second FET contact pad is the gate pad, plate 810 becomes the contact for the FET source and strip 820 becomes the contact for the FET gate. The FET drain pad on the chip side opposite to source and gate is area 1011.

Figure 11:
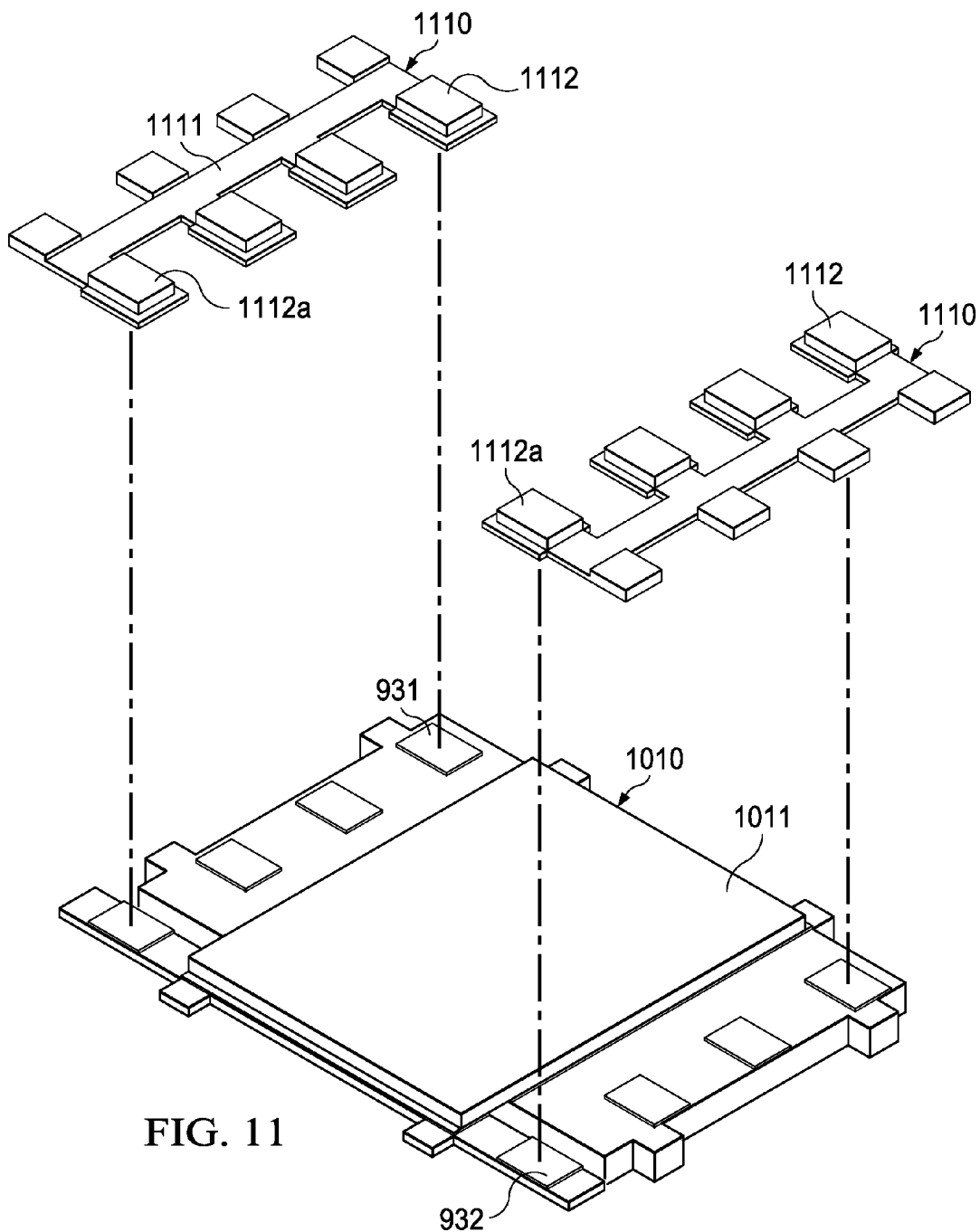

In the next process step depicted in FIG. 11, piece parts 1110 are provided for attachment onto solder patches 931 and 932. The piece parts have been formed so that they provide a plurality of leads (terminals) 1112 and 1112a for attachment to solder patches on the coplanar surface of the flat leadframe plate and strip: Terminals 1112 onto solder patches 931, and terminals 1112a onto solder patches 932. The advantage of adding the terminals as additional piece parts to a flat leadframe plate, rather than forming them together with the plate formation, is the opportunity to customize the terminal number, size, and position at short notice in order to satisfy customer wishes without significant increase in cost and manufacturing time. An additional advantage is the freedom to either make terminals 1110 of the same metal as the leadframe (for example, copper), or to make them of a different metal (for example, nickel). A further advantage is the option to selectively plate the surfaces of terminals 1112 and 1112a with a thin metal layer for enhancing solderability; metal examples include a layer of silver, or a stack of layers including nickel, palladium and gold. The height of the terminals is determined by the thickness of chip 1010 so that after attachment the terminal surfaces are coplanar with chip surface 1011 (the chip's third contact pad). The connecting metal 1111 between terminals 1112 will be removed by a trimming technique (such as sawing) in the final singulation step of the packaging process.

Figure 9:
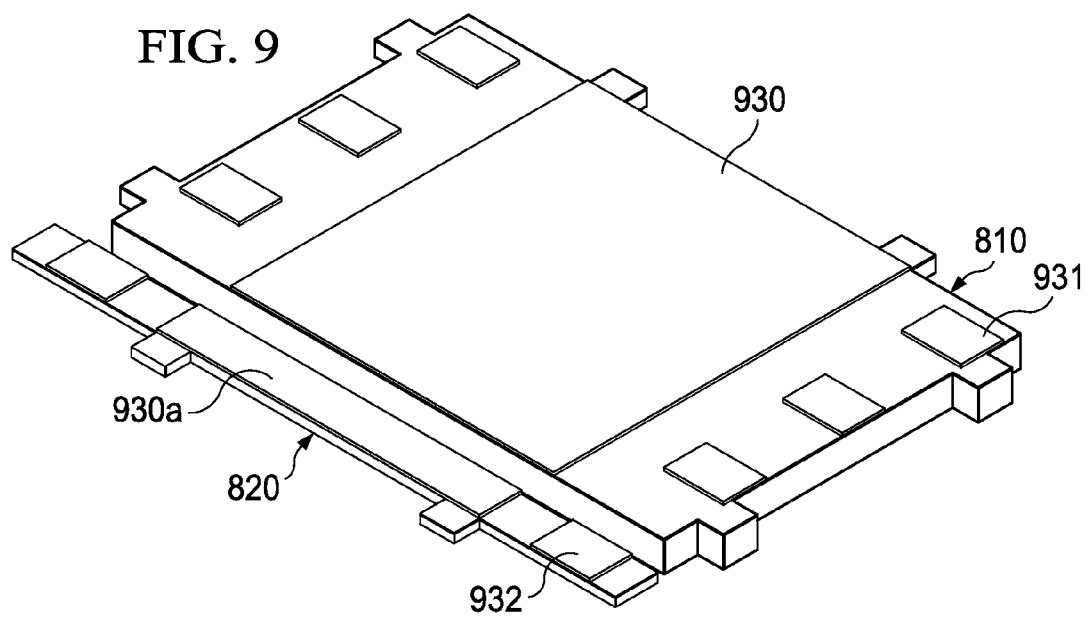

As described in FIG. 9, the same attachment material (for example, solder) is applied to leadframe plate and strip. After the piece parts 1110 have been aligned and brought into contact with solder patches 931 and 932, the final step of attachment is common to chip and piece parts. For example, when the attachment material is a solder paste, the temperature excursion for solder reflow is common for solder of patches 930, 930a, 931 and 932. The chip's first pad (source) and second pad (gate) are attached concurrently with the attachment of the terminals 1112 and 1112a. The result is displayed in FIG. 12. Consequently, the surfaces of the third chip pad (drain) 1011 and of terminals 1112 and 1112a are coplanar and thus available for attachment to an external board.

Figure 12:
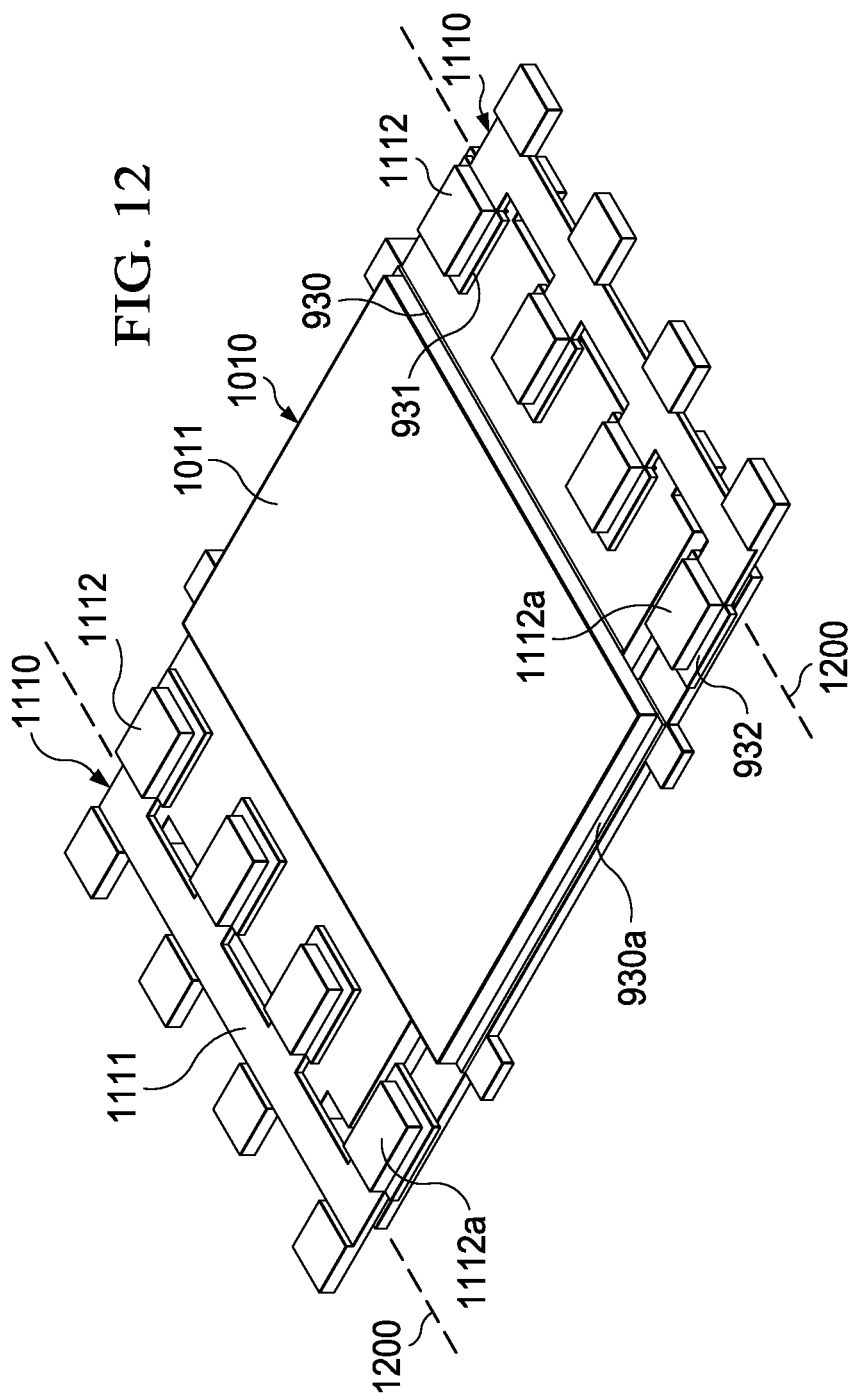

In the next process step, the assembled device of FIG. 12 is encapsulated in a packaging compound to form a coherent device as displayed in FIG. 2. A preferred encapsulation method is a transfer molding technique using an epoxy-based thermoset molding compound, which is electrically insulating. The encapsulation process integrates the FET chip, the leadframe and the terminals into a package with a thickness substantially equal to the sum of the plate (first) thickness and the chip (third) thickness. Finally, trimming and singulation steps along the directions of the dashed lines 1200 of FIG. 12 create the device contours as illustrated in FIG. 2. It should be stressed that the encapsulation process fills the thickness difference between leadframe plate 110 and leadframe strip 120 (see FIG. 2 and FIG. 1), as well as any spaces between chip 210 and terminals 212 and 212a. Consequently, the packaging compound covers the leadframe strip as viewed from the top device surface. In addition, the surface of the encapsulation compound on the bottom side of the device (102 in FIG. 2) is coplanar with the third chip pad (drain; 211 in FIG. 2; 1011 in FIG. 12) and the terminals (212 and 212a in FIG. 2; 112 and 112a in FIG. 12). The opposite surface of the encapsulation compound (101 in FIG. 1) is coplanar with plate surface 111.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the packaged device may include one, two or more semiconductor chips. It also may include more than one heat sink. As yet another example, the power FET chip may be configured to have drain and gate terminals on one device side and the source terminal on the opposite side (attached to the leadframe plate), or it may be configured to have source and gate terminals on one device side and the drain terminal on the opposite side (attached to the leadframe plate). It is therefore intended that the appended claims encompass any such modifications or embodiments.

We claim:

1. A power transistor package comprising:
a leadframe including a flat plate and a coplanar flat strip spaced from the plate, the plate having a first thickness and the strip having a second thickness smaller than the first thickness, the plate and the strip having terminals;
a field-effect power transistor chip having a third thickness, a first and a second contact pad on one chip side, and a third contact pad on the opposite chip side, the first pad being attached to the plate, the second pad being attached to the strip, and the third pad being coplanar with the terminals; and
encapsulation compound filling the thickness difference between plate and strip, and spaces between chip and terminals, wherein the compound has a surface coplanar with the plate and the opposite surface coplanar with the third pad and the terminals, the distance between the surfaces being equal to the sum of the first and third thicknesses.

2. The package of claim 1 further including a heat sink attached to the leadframe plate.

3. The package of claim 1 wherein the attachments of the transistor pads and the leadframe plate and strip include layers of a material selected from a group including solder, conductive adhesive, z-axis conductor, carbon tubes, and rapheme material.

4. The package of claim 3 wherein the terminals are attached to the plate and strip by layers of a material selected from a group including solder, conductive adhesive, z-axis conductor, carbon tubes, and rapheme material.

5. The package of claim 1 wherein the leadframe and the terminals are made of the same metal.

6. The package of claim 1 wherein the leadframe and the terminals are made of different metals.

7. The package of claim 1 further including a deposited metal layer patterned for covering the third pad and the terminals.

8. The package of claim 7 wherein the metal of the deposited layer is selected from a group including tin, copper, consecutive layers of copper, nickel, and tin, consecutive layers of copper, nickel and gold, and consecutive layers of a refractory metal and aluminum.

9. The package of claim 8 wherein the deposited metal layer is patterned in a customized pattern.

10. The package of claim 1 wherein the package is free of metal clips and wires.

\* \* \* \* \*